United States Patent [19]
Han

[11] Patent Number: 6,016,275
[45] Date of Patent: Jan. 18, 2000

[54] FLASH MEMORY WEAR LEVELING SYSTEM AND METHOD

[75] Inventor: Sang-Wook Han, Seoul, Rep. of Korea

[73] Assignee: LG Semicon Co., Ltd., Cheongju, Rep. of Korea

[21] Appl. No.: 09/185,709

[22] Filed: Nov. 4, 1998

[30] Foreign Application Priority Data

Mar. 13, 1998 [KR] Rep. of Korea .......................... 98-8487

[51] Int. Cl.⁷ .................................................. G11C 13/00
[52] U.S. Cl. ...................................... 365/185.29; 365/218
[58] Field of Search ............................. 365/185.29, 218, 365/189.07, 185.33

[56] References Cited

U.S. PATENT DOCUMENTS

| | | | |
|---|---|---|---|
| 5,341,339 | 8/1994 | Wells | 365/218 |
| 5,568,423 | 10/1996 | Jou et al. | 365/185.33 |
| 5,715,193 | 2/1998 | Norman | 365/185.24 X |
| 5,719,808 | 2/1998 | Harari et al. | 365/185.29 X |
| 5,805,501 | 9/1998 | Shiau et al. | 365/185.29 |
| 5,809,515 | 9/1998 | Kaki et al. | 365/185.29 X |
| 5,912,848 | 6/1999 | Bothwell | 365/185.29 X |
| 5,917,757 | 6/1999 | Lee et al. | 365/185.29 X |
| 5,920,501 | 7/1999 | Norman | 365/185.29 X |

*Primary Examiner*—Do Hyun Yoo
*Attorney, Agent, or Firm*—Fleshner & Kim

[57] ABSTRACT

A wear leveling system and method of a flash memory cell uses the amount of time required to perform an erasing operation on a sector of the flash memory to determine whether the memory cells in the sector have degraded to an unacceptable level. The actual time required to erase a sector of a flash memory array is compared to a reference erasing time required to erase a unit sector under the state of the worst allowable degradation. If the actual erasing time of a sector exceeds the reference erasing time, logical addresses corresponding to the sector are re-mapped to the physical addresses of a different sector. On the other hand, when the actual erasing time is shorter than or equal to the reference erasing time, a controller continues to use the unit sector.

19 Claims, 4 Drawing Sheets

FLASH MEMORY WEAR LEVELING SYSTEM AND METHOD

BACKGROUND OF THE INVENTION

1. Field of the Invention

The present invention relates to systems and methods for wear leveling an electrically erasable and programmable read only memory (EEPROM).

2. Background of the Related Art

In general, computer systems use a hard disk as a long term memory device. However, hard disk devices are heavy, bulky and cannot withstand physical impacts due to mechanical characteristics of the devices. Therefore, much care is required to use a hard disk in a portable system such as a notebook computer.

Recently, use of an EEPROM, also known as a flash memory, which has good durability and large memory capacity has become more common. In some applications, flash memory are replacing electromechanical hard disks.

A flash memory comprises a plurality of unit memory cells, each of which has one or more MOS transistors. Each transistor has two gates, a floating gate and a control gate. The floating gate is typically covered with an oxide film ($SiO_2$), and the floating gate is located between a substrate and a control gate. The transistor can switch between two logic states by implanting or erasing electric charges into or from the floating gate. That is, when a relatively high voltage is applied to the control gate to generate a strong electric field between the control gate and substrate, electrons are moved from the substrate to the floating gate. If the voltage supply to the control gate is stopped, the electric charges on the floating gate do not escape from the floating gate to the external due to the oxide film, thereby storing data.

The more times data is written to and erased from a flash memory cell, the more degraded the transistor of the memory cell will become due to the high voltages applied to the transistor. After a large number of data storage and erasing operations, the data storage function fails to be satisfactorily carried out.

One difference between a flash memory and a general EEPROM is that in a flash memory, data is erased by block unit. A flash memory cell array typically comprises a plurality of unit sectors, where each unit sector has a data storage capacity of a few hundred bytes. When writing data, it is possible for only a part of the memory cells of a unit sector to be used. On the other hand, when the data is erased, a whole unit sector is erased, regardless of whether particular memory cells of the unit sector are storing data That is, data is erased by unit sector.

Since flash memory cells are degraded during the process of writing and erasing data, the memory cells must be checked to determine if a sector may be used before data is written to the sector. If the sector has degraded too much, the data is written to a different, less degraded sector. This process is called wear leveling.

FIG. 1 is a block diagram showing a controller and memory cell array of a background art flash memory. The memory cell array 30 comprises a plurality of unit sectors and a sector information table. The unit sectors store data, and the sector information table stores information on each unit sector, including the physical address corresponding to a logical address, and the number of time each sector has been erased.

The address converter 21 within the controller 20 converts a logical address generated in a host 10 (typically a microprocessor) to the corresponding physical address, and then reads data from or writes data to the corresponding sector. The controller 20 controls data writing/erasing operations of the memory cell array 30, and periodically rearranges relationships between logical addresses and physical addresses by remapping the memory cell array when a unit sector becomes too degraded.

A comparator 22 for comparing the number of erasing times a sector has been erased is another element of the controller 20. The comparator 22 has a value, obtained by testing, which represents an initial reference number of erasing times. The testing is performed to determine the maximum number of data writing and erasing operations that can be performed, based on operational characteristics of the unit memory cell, before a cell becomes too degraded. The comparator 22 compares the reference number of erasing times to the actual number of times each unit sector has been erased using the information stored in the sector information table of the memory cell array 30. If the two numbers are identical for a sector, the memory cell array is re-mapped so that the degraded cell is not used to store data.

FIG. 2 shows a unit sector of a background art memory cell array. The unit sector is divided into an overhead area and a user's area. The user's area is a simple data storage area 32 and the overhead area comprises a miscellaneous information area 33 and an erasing tracking area 34 for storing the number of times the sector has been erased. The miscellaneous information storage area 33 stores various information regarding the sectors, including the physical address, valid bits and dirty bits.

If a sector of a flash memory has a data storing capacity of 512 bytes, and the full data storing capacity of the flash memory array is 2 gigabytes, the unit sectors must be capable of storing more than 2 gigabytes of data. This is because each sector of the flash memory cell array must track data in an overhead area Therefore, for any given capacity flash memory, the overhead area of the flash memory array increases the data storage requirements of the device. A significant portion of this additional data storage requirement is due to the portion of the overhead area used to track the number of times each sector has been erased.

Due to errors that can occur during the manufacturing process, unit memory cells may fail to have uniform characteristics. For this reason, a particular memory cell may degrade more rapidly than other memory cells for the same number of data erasing operations. In this case, a part of a sector may be degraded, and fail to store data, even if the number of erasing times of the unit sector has not reached the reference number of erasing times obtained by testing. As a result, the data storing capacity of the whole sector is not reliable.

SUMMARY OF THE INVENTION

It is an object of the present invention to provide a wear leveling system and method that substantially obviates one or more of the problems of the background art.

Another object of the present invention is to provide a wear leveling system and method that provides a high reliability in checking the stage of degradation of unit sectors of a flash memory cell array.

Another object of the present invention is to provide a wear leveling method that is based on the data erasing time of unit sectors.

A wear leveling method embodying the invention includes the steps of detecting the time required to complete an erasing operation of a sector in the flash memory cell array; and determining whether to continue using the sector based on the detected erasing time. In other methods embodying the invention, the detected erasing time may be compared to a predetermined time to determine the wear status of the sector.

In another method embodying the invention for wear leveling a flash memory cell array, the amount of time required to erase data from all memory cells of a sector array is detected and the memory cell array is re-mapped if the detected erasing time exceeds a predetermined reference erasing time so that the sector is no longer used to store data.

In a wear leveling system of a flash memory cell array embodying the invention, a detector is configured to detect an amount of time required for all memory cells of a sector of the flash memory cell array to be erased and a comparator is configured to compare a reference erasing time to the detected erasing time. A system embodying the invention may also include means for re-mapping the flash memory cell array to avoid storing data in a unit sector which has become degraded due to an excessive number of writing and erasing operations.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements, and wherein.

DETAILED DESCRIPTION OF PREFERRED EMBODIMENTS

Figure 3:
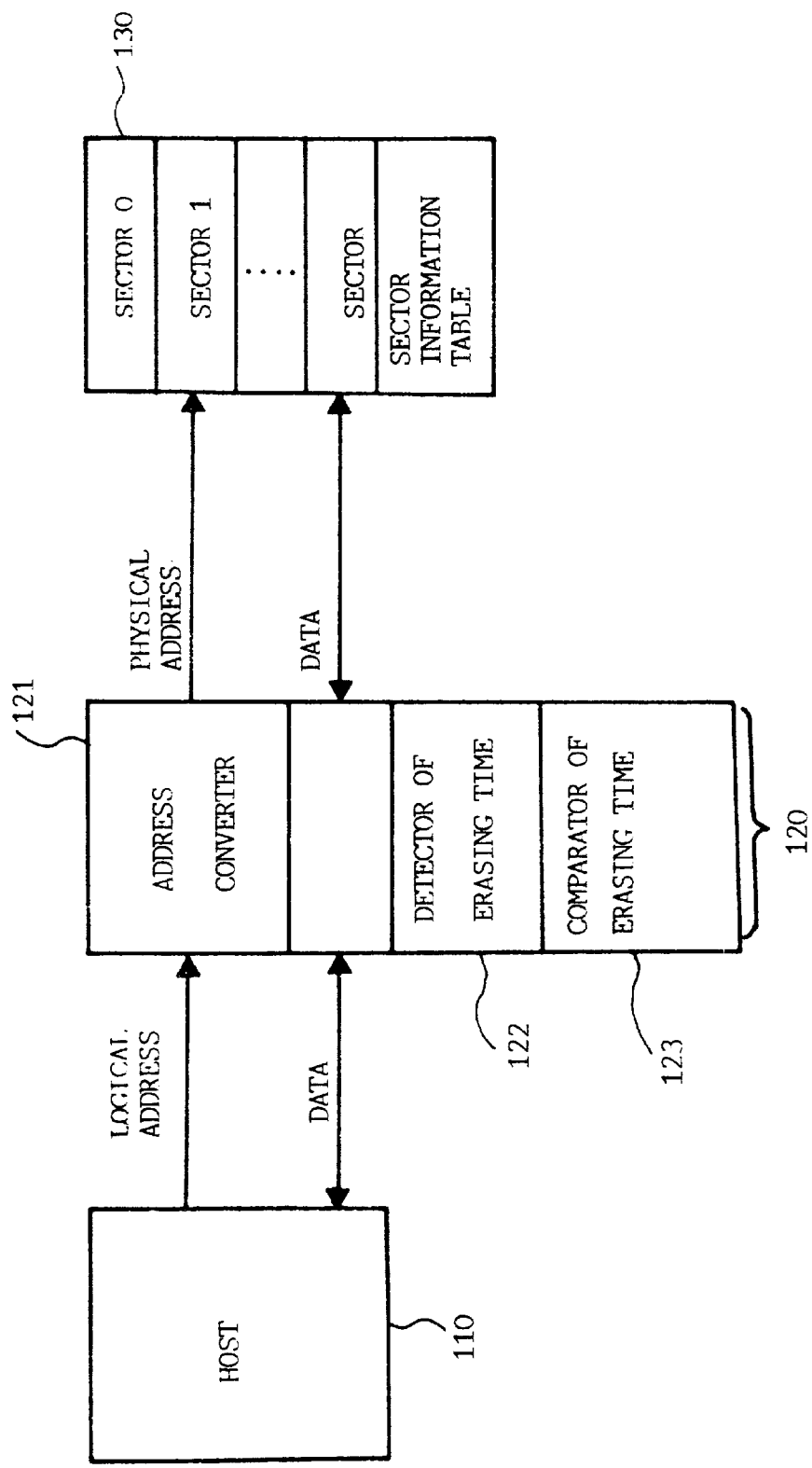
FIG. 3 is a block diagram illustrating a flash memory cell array according to the present invention.

FIG. 3 is a block diagram showing a controller and memory cell array of a flash memory cell array embodying the present invention. The memory cell array 130 comprises a plurality of unit sectors in which data is written and stored, and a sector information table in which information for each unit sector, such as the physical address corresponding to a logical address, is stored.

The address converter 121 in the controller 120 converts the logical address generated in the host 110 to a physical address. The controller then reads data stored in, or writes data to the sector corresponding to the relevant physical address. The controller 120 controls data writing/erasing operations of the memory cell array, and re-arranges the relationships between the logical address and physical address by re-mapping the memory cell array as necessary.

Another element of the controller 120 is the detector of erasing time 122. The detector 122 detects the amount of time required for data stored in a unit sector of the memory cell array 130 to be erased. The data erasing time of a flash memory cell is proportional to the stage of degradation of the memory cell.

The comparator of erasing time 123 has a reference value, obtained by testing, which represents the maximum allowable erasing time before a memory cell is considered too degraded. The testing is performed to determine the maximum allowable data erasing time based on characteristics of the unit memory cell. The comparator 123 is configured to compare the reference erasing time to real erasing times detected by the erasing time detector 122. If the real erasing time of a memory cell of a sector is longer than the reference erasing time, the memory cell array 130 is remapped so that the logical address that was assigned to the sector is reassigned another unit sector. On the other hand, if the real erasing time of memory cells of a sector is shorter than or equal to the reference erasing time, the controller continues to read data from and write data to the memory cells of that sector.

The data erasing time of a unit sector is the time required to perform an erasing operation for all cells in the sector (since all cells in a sector are erased simultaneously). Therefore, if the data erasing time of a particular memory cell in a sector is longer than that of other cells in the sector, the data erasing time of the overall unit sector will still be long enough to trigger the controller to remap the logical address to a new sector. If the data erasing time of the unit sector is over the limit obtained by a test, the sector is no longer considered reliable.

Figure 1:
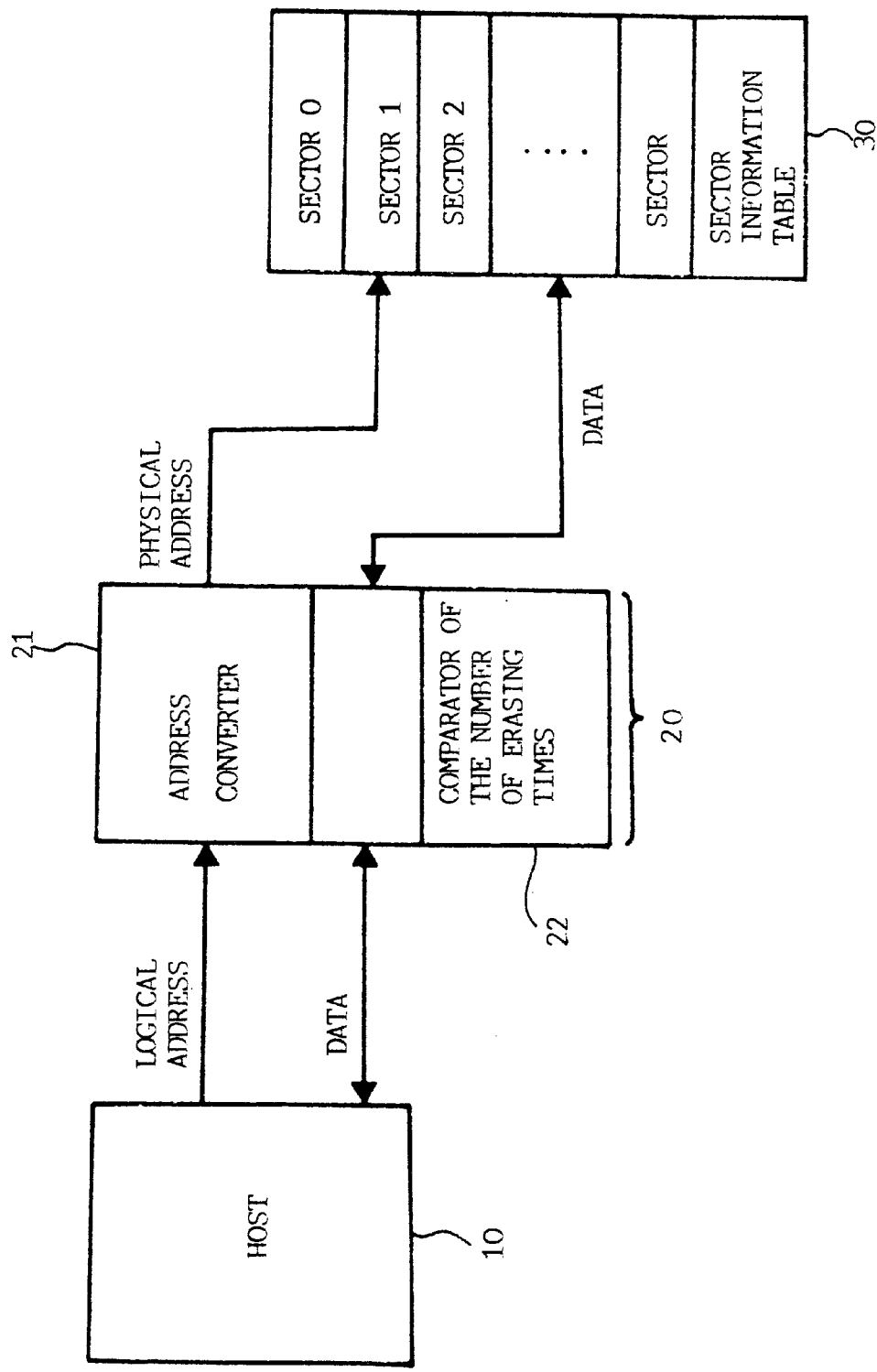
FIG. 1 is a block diagram illustrating a background art flash memory cell array.
Figure 2:
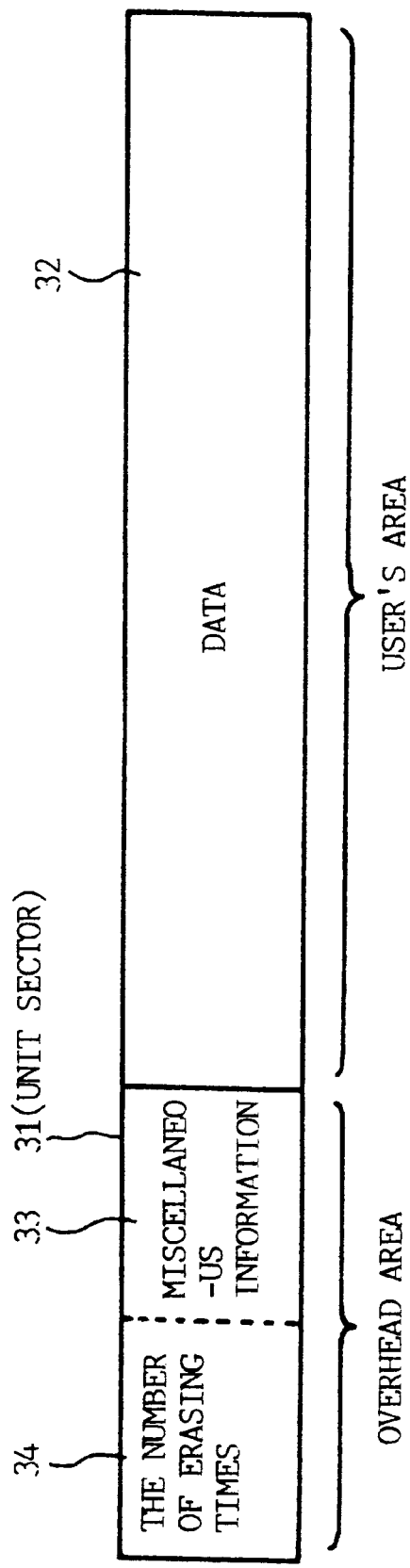
FIG. 2 shows a unit sector of the background art flash memory cell array of FIG. 1.
Figure 4:
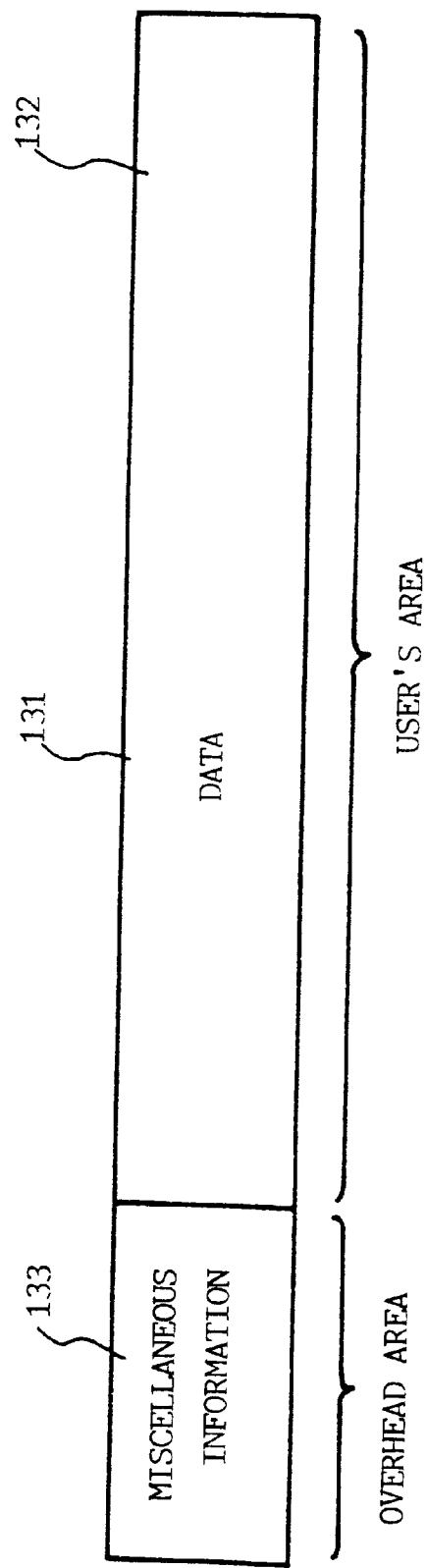
FIG. 4 shows a unit sector in the flash memory cell array of FIG. 3.

FIG. 4 shows an unit sector of a flash memory cell array according to the present invention. Different from the background art unit sector shown in FIG. 2, the overhead area does not have an area for storing of the number of times the cells have been erased. In the wear leveling system of the present invention, because wear leveling is not dependant on the number of erasing operations, it is unnecessary to store the number data erasing operations. Because a flash memory device embodying the present invention does not require as much overhead storage area, a device embodying the invention can store more data than a similar sized background art device.

The background art wear leveling system is based on the number of data erasing times of the overall unit sector, regardless of the stage of degradation of each memory cell. Thus, the degradation judgment is not based on the actual condition of the memory cells. In contrast, in a wear leveling system of the present invention, the degradation judgment is based on the actual detected condition of the memory cells, and the actual condition is compared to a worst case reference number, thereby providing a higher reliability.

The foregoing embodiments are merely exemplary and are not to be construed as limiting the present invention. The present teaching can be readily applied to other types of apparatuses. Many alternatives, modifications, and variations will be apparent to those skilled in the art. In the claims, means-plus-function clauses are intended to cover the structures described herein as performing the recited function and not only structural equivalents but also equivalent structures. For example, although a nail and a screw may not be structural equivalents in that a nail employs a cylindrical surface to secure wooden parts together, whereas a screw employs a helical surface, in the environment of fastening wooden parts, a nail and a screw may be equivalent structures.

What is claimed is:

1. A method of wear leveling a flash memory cell array, comprising the steps of:

detecting the time required to complete an erasing operation on a sector of the memory cell array; and determining whether to continue using the sector based on the detected erasing time.

2. The method of claim 1, wherein the determining step comprises: comparing the detected erasing time to a reference erasing time.

3. The method of claim 2, wherein the determining step further comprises determining that the sector should not be used if the detected erasing time exceeds the reference erasing time.

4. The method of claim 3, wherein the determining step further comprises determining that the sector should continue to be used if the detected erasing time is equal to or less than the reference erasing time.

5. The method of claim 3, further comprising the step of re-mapping the memory cell array if the detected erasing time exceeds the reference erasing time.

6. The method of claim 5, wherein the remapping step comprises assigning a logical address that corresponded to the sector to the physical address of a different sector.

7. The method of claim 1, wherein the detecting step comprises detecting the time required to erase all memory cells of the sector.

8. A wear leveling system of a flash memory cell array, comprising:
 a detector configured to detect an amount of time required for memory cells of a sector of said flash memory cell array to be erased; and
 a comparator configured to compare a reference erasing time to said detected erasing time.

9. The system of claim 8, wherein said reference erasing time is a time required for all memory cells of a sector to be erased under the state of the worst allowable degradation.

10. The system of claim 8, further comprising an address converter configured to convert logical addresses to physical addresses of the memory cell array.

11. The system of claim 10, wherein the address converter is also configured to re-map a logical address corresponding to the physical address of a first sector to the physical address of a second sector when the detected erasing time of the first sector is longer than said reference erasing time.

12. The system of claim 8, wherein the system is configured such that when an erasing time of a sector exceeds the reference erasing time, the sector is no longer used to store data.

13. A wear leveling method of a flash memory cell array having at least one sector, comprising the steps of:
 detecting a data erasing time of a sector in said flash memory cell array; and
 comparing the detected data erasing time to a predetermined reference erasing time to check the wear status of the sector.

14. The method of claim 13, wherein said wear leveling method further comprises the steps of:
 converting a logical address generated in a host to a physical address of the memory cell array;
 erasing data stored in the sector corresponding to the physical address; and
 re-mapping the logical address to a new physical address of an available sector when said detected erasing time is longer than said reference erasing time.

15. The method of claim 14, wherein said reference erasing time is the time required to erase all memory cells of a sector under the state of the worst allowable degradation.

16. The method of claim 13, further comprising the step of re-mapping the memory cell array if the detected erasing time exceeds the reference erasing time.

17. A method of wear leveling a flash memory cell array, comprising the steps of:
 detecting a time required to erase data from memory cells of a sector of the memory cell array; and
 re-mapping the memory cell array if the detected erasing time exceeds a predetermined reference erasing time so that the sector is no longer used to store data.

18. The method of claim 17, wherein the re-mapping step comprises reassigning a logical address corresponding to a physical address of the sector to a new physical address of an available sector.

19. The method of claim 17, wherein during the detecting step, all memory cells in the sector are erased substantially simultaneously.

* * * * *